(12) United States Patent
Seely et al.

(10) Patent No.: US 6,369,678 B1
(45) Date of Patent: Apr. 9, 2002

(54) RF ASSEMBLY WITH GROUND-PLANE SLOT BETWEEN COMPONENTS AND METHOD THEREFOR

(75) Inventors: Warren Leroy Seely, Chandler; Ronald Dee Fuller, Mesa; Ronald Frank Kielmeyer, Jr., Tempe, all of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/592,085

(22) Filed: Jun. 12, 2000

(51) Int. Cl.$^7$ ................................. H01P 3/08
(52) U.S. Cl. ........................ 333/246; 333/247
(58) Field of Search .................. 333/246, 238, 333/247

(56) References Cited

U.S. PATENT DOCUMENTS

| | | | |
|---|---|---|---|
| 5,428,191 A | * | 6/1995 | Chandler et al. .......... 174/261 |
| 5,508,666 A | * | 4/1996 | Nguyen ...................... 333/33 |
| 6,049,262 A | * | 4/2000 | Mazzochette .............. 333/238 |
| 6,269,863 B1 | * | 8/2001 | Wyler ....................... 165/80.3 |

* cited by examiner

*Primary Examiner*—Justin P. Bettendorf
*Assistant Examiner*—Joseph Chang
(74) *Attorney, Agent, or Firm*—Frank J. Bogacz

(57) ABSTRACT

An RF assembly (20) operating at a predetermined wavelength of $\lambda$ and having a ground-plane interface (26) between first and second components (22, 24) is presented. A bond wire (48) couples the components (22, 24) along a bond-wire directrix (54). The components (22, 24) have grounding members (30, 32) establishing substantially coplanar ground planes (42, 44). The grounding members (30, 32) are coupled together so as to create a semi-cylindrical slot (28) having an opening (60) substantially coincident with the ground planes (42, 32). The slot 28 has an axis (66) proximate the bond-wire directrix (54), and a radius (68) substantially equal to $\lambda/2$. The slot axis (66) and the bond-wire directrix (54) are located within a plane (56) substantially perpendicular to the ground planes (42, 32).

19 Claims, 1 Drawing Sheet

RF ASSEMBLY WITH GROUND-PLANE SLOT BETWEEN COMPONENTS AND METHOD THEREFOR

TECHNICAL FIELD OF THE INVENTION

The present invention relates to the field of RF assembly components. More specifically, the present invention relates to ground-plane interfaces between RF assembly components.

BACKGROUND OF THE INVENTION

In the design and implementation of microwave and millimeter-wave radio-frequency (RF) assemblies, there is often a need to interface component sub-assemblies, e.g., a gallium arsenide (GaAs) power amplifier with attendant heat sink to a printed-circuit board assembly. At these wavelengths, it is desirable that the interfaces between two components have electronically contiguous grounds. That is, the ground planes associated with any given signal should have substantially zero impedance over the inter-component interface.

Utilizing conventional interfacing techniques, the ground of one component is coupled to the ground of another component through the use of seam soldering, specialized contact assemblies, or direct grounding-member contact. All such conventional interfacing techniques present problems at short wavelengths.

With seam soldering, a grounding member of a first component is positioned adjacent a grounding member of a second component so as to produce a seam between the grounding members in the form of a small crack. This seam is then soldered over a significant portion of its length. That is, solder is flowed into and over the crack, thereby producing essentially a contiguous grounding member providing an acceptable electrical ground interface between the components.

Unfortunately, seam soldering is a labor-intensive production procedure. Also, a significant risk of component damage from thermal stress exists with this procedure. The use of seam soldering therefore adds significantly to production costs while simultaneously reducing production yield.

In addition, the use of seam soldering renders an assembly difficult or impossible to repair. In the event of component failure, the entire assembly, rather than the defective component, often requires replacement. This significantly increases the costs of repair and maintenance. Where the assembly is not easily accessible, as in a satellite, the cost increase may become prohibitive.

Where the ability to effect component replacement justifies the additional costs involved, specialized contact assemblies may be used. With specialized contact assemblies, a contact assembly is affixed to each component and mated to provide the requisite interface. Through the use of specialized contact assemblies, relatively good impedance matches are provided, minimizing discontinuities.

Unfortunately, specialized contact assemblies require additional components and production steps, thus increasing production costs. In addition, the interfaces between the components and the specialized contact assemblies must be accounted for in the design of the components. This may increase the complexity of component design, again increasing overall assembly costs.

Also, just as a plug-and-socket assembly is unlikely to be as electrically sound as a continuous wire, specialized contact assemblies are unlikely to be as good as a continuous ground plane and circuit. This is increasingly true as wavelength decreases. To compensate for interconnection problems, such specialized contact assemblies may be formed of or incorporate precious metals and other costly materials. Similarly, the specialized contact assemblies may also or alternatively incorporate costly interfacing techniques. Such materials and/or techniques further increase the cost of assembly production. Moreover, such materials and/or techniques often require significant soldering operations that risk thermal damage to other subassembly components.

The simplest and least expensive method of providing a ground interface between components of an RF assembly is to provide direct grounding-member contact. In this case, the grounding members of the components are machined, cast, or otherwise formed to be mechanically complimentary, i.e., to fit together snuggly. The grounding members are then mechanically coupled, typically by means of one or more screws, so as to provide the necessary mechanical and electrical contact.

Since direct grounding-member contact requires no solder or additional components, the ability to effect repairs in the field by the replacement of components is maximized. Often, such replacements may be effected by personnel with minimum training and utilizing no special tools. Direct grounding-member contact is therefore extremely cost effective.

Unfortunately, direct grounding-member contact has its own problems. For example, thermal and vibrational stresses may cause the contact to loosen. Corrosion, from either contamination or electrolytic action, may affect contact quality. A loose or otherwise poor contact may cause severe discontinuity at the interface, resulting in unpredictable impedance characteristics.

Additionally, a loose or poorly fitting interface between grounding members may result in gaps or holes. At microwave and millimeter-wave frequencies, such gaps or holes may act as waveguide stubs of indeterminate lengths. Such stubs produce echoes, ringing, and other noises that may severely degrade the signal.

What is needed, therefore, is a method of interfacing components of microwave or millimeter-wave assemblies that allows efficient, cost-effective production of the assemblies. This assembly method should be labor-conservative, should not subject the components to undue thermal stresses, and should not involve the use of additional devices beyond the components themselves. This assembly method should result in an assembly that is easily reparable in the field in the event of component failure without requiring either specialized tools or training.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION OF THE PREFERRED EMBODIMENTS

Figure 1:
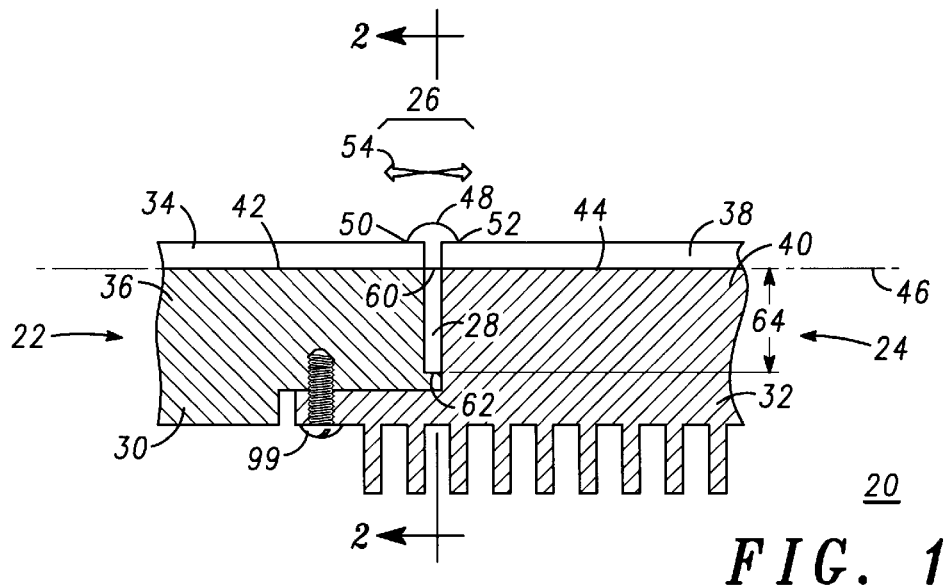
FIG. 1 shows a cross-sectional view depicting portions of two components of an RF assembly and demonstrating a ground-plane interface having a straight slot in accordance with a preferred embodiment of the present invention.
Figure 3:
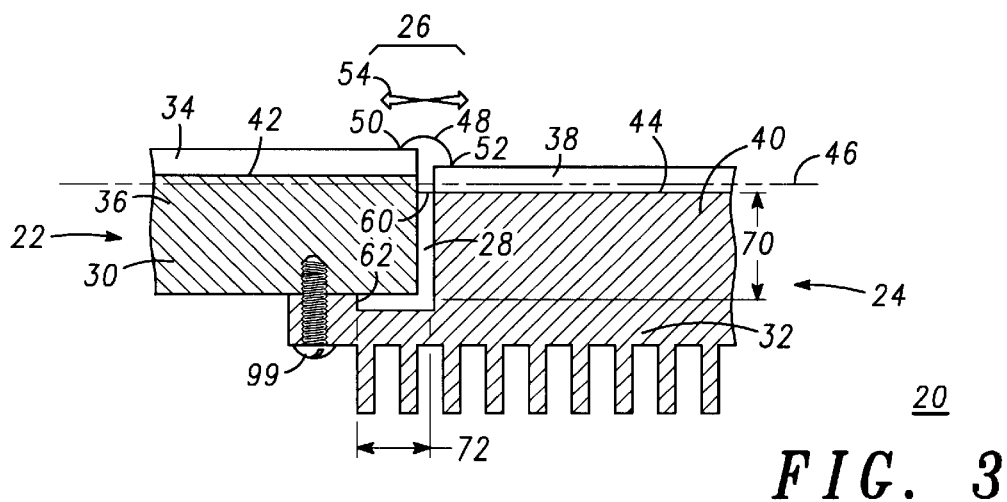
FIG. 3 shows a cross-sectional view depicting portions of two components of an RF assembly and demonstrating a ground-plane interface having a bent slot in accordance with an alternative preferred embodiment of the present invention.

FIGS. 1 and 3 show cross-sectional views depicting a portion of a microwave or millimeter-wave radio-frequency (RF) assembly 20 having a first component 22 physically and electronically coupled to a second component 24 so as to form a ground-plane interface 26 in accordance with preferred embodiments of the present invention. Ground-plane interface 26 forms a slot 28 between components 22 and 24. In FIG. 1, slot 28 is straight. In FIG. 3, slot 28 is bent.

Figure 2:
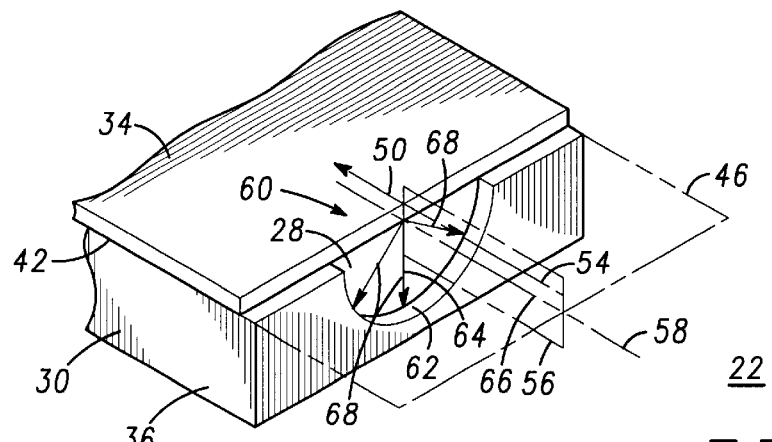
FIG. 2 shows an isometric view depicting an end portion of a first component along section 2—2 of FIG. 1 demonstrating a semi-cylindrical slot in accordance with a preferred embodiment of the present invention.

FIG. 2 shows an isometric view depicting an end of first component 22 along section 2—2 of FIG. 1. Slot 28 is demonstrated in FIG. 2 as being semi-cylindrical in accordance with a preferred embodiment of the present invention.

RF assembly 20, as exemplified in the Figures, incorporates first component 22 and second component 24. Each of first and second components 22 and 24 has an associated grounding member 30 and 32, respectively. For example, first component 22 may be taken to be a printed-circuit (PC) board 34 or like component backed by a metal plate 36 as grounding member 30. Similarly, second component 24 may be taken as a gallium arsenide (GaAs) power-amplifier module 38 having a metal heat sink 40 as grounding member 32.

In first component 22, metal plate 36 (i.e., first grounding member 30) establishes a first ground plane 42 at its interface with PC board 34. First ground plane 42 serves as a ground reference for components (not shown) of PC board 34. Similarly, in second component 24, heat sink 40 (i.e., second grounding member 32) establishes a second ground plane 44 at its interface with GaAs module 38. Second ground plane 44 serves as a ground reference for components (not shown) of GaAs module 38.

First component 22 and second component 24 are mechanically joined together in a conventional manner. In FIGS. 1 and 3, this mechanical joining is accomplished through use of screws 99 (only one shown) coupling second grounding member 32 to first grounding member 30. Those skilled in the art will appreciate that the use of other coupling methods does not depart from the spirit of the present invention.

Preferably, grounding members 30 and 32 are formed so that, when grounding members 30 and 32 are coupled together, first ground plane 42 is aligned with (i.e., coplanar with) second ground plane 44 (FIG. 1). When ground planes 42 and 44 are coplanar, a reference plane 46 is formed between planes 42 and 44, i.e., coplanar with planes 42 and 44. Reference plane 46 serves as a common ground reference for components (not shown) of PC board 34 and GaAs module 38, as well as for slot 28 (discussed hereinafter).

Those skilled in the art will appreciate, however, that it is not a requirement of the present invention that first and second ground planes 42 and 44 be coplanar. When first ground plane 42 is parallel to, but not coplanar with, second ground plane 44 (FIG. 3), then reference plane 46 may be considered as being formed parallel to and between planes 42 and 44, preferably midway between planes 42 and 44. In this case, reference plane 46 serves as a ground reference for slot 28 (discussed hereinafter).

Those skilled in the art will also appreciate that, when other relationships exist between first and second ground planes 42 and 44 (e.g., when planes 42 and 44 are not parallel), reference plane 46 is formed relative to planes 42 and 44 in a conventional manner. It is a function of reference plane 46 to serve as a ground referent for slot 28 in a manner discussed hereinafter. The use of alternative relationships between ground planes 42 and 44, and the resultant alternative formations of reference plane 46 resulting therefrom, does not depart from the spirit of the present invention.

When a signal (not shown) is to propagate between first and second components 22 and 24, this signal is conventionally propagated over a bond wire 48 (FIGS. 1 and 3). In the exemplary embodiments, bond wire 48 is coupled to PC board 34 (i.e., first component 22) at a first predetermined point 50 (FIGS. 1, 2, and 3) and to GaAs module 38 (i.e., second component 24) at a second predetermined point 52 (FIGS. 1 and 3). A directrix 54 of bond wire 48 exists in a plane 56 passing through points 50 and 52 and substantially perpendicular to reference plane 46, i.e., substantially perpendicular to ground planes 42 and 44 when ground planes 42 and 44 are coplanar and/or parallel.

At least one of grounding members 30 and 32 is fashioned, by machining, casting, or other method known to those skilled in the art, so that when grounding members 30 and 32 are coupled, slot 28 is formed proximate to bond wire 48 and substantially perpendicular to reference plane 46. Preferably, slot 28 is formed most proximate bond wire 48, with a transverse centerline 58 of slot 28 closest to bond wire 48. That is, transverse centerline 58 is located within plane 56 along with directrix 54 (FIG. 2).

The signal (not shown) propagating over bond wire 48 has a component at wavelength $\lambda$. Between first and second components 22 and 24, this signal is formed between bond wire 48 and reference plane 46. Slot 28 is formed as a blind slot substantially perpendicular to and having an opening 60 substantially coplanar with reference plane 46.

Being substantially perpendicular to reference plane 46 at opening 60, slot 28 serves as a transmission-line stub for the signal. That is, a portion of the signal will propagate into slot opening 60. This signal portion will reflect from a closed end 62 of slot 28 and propagate back towards opening 60. Slot 28 has a depth 64 of $\lambda/2$ (FIG. 1) as measured between slot opening 60 (i.e., from reference plane 46) and closed end 62. This being the case, the reflected signal arriving at opening 60 will be in phase with the original signal. This produces an effective ground impedance between first grounding member 30 and second grounding member 32 of substantially zero. This effect is increased by forming slot 28 as a semi-cylindrical slot 28 (FIG. 2). Transverse centerline 58 of slot 28 is then an axis 66 of the semicylinder, and depth 64 of slot 28 is any radius 68 of the semicylinder. The result is an effectively contiguous ground plane extending over first and second grounding members 30 and 32, i.e., through ground-plane interface 26 between first and second components 22 and 24.

Those skilled in the art will appreciate that, mathematically, depth 64 (i.e., radius 68) may be $N\lambda/2$, where "N" may be any positive odd integer. Setting N>1 does not depart from the spirit of the present invention.

In FIG. 1, slot 28 is depicted as straight and having a depth 64. Those skilled in the art will appreciate that slot 28 may be bent. That is, as depicted in FIG. 3, slot 28 may proceed in one direction for a first depth portion 70, then proceed in another direction for a second depth portion 72. In the exemplary embodiment of FIG. 3, the sum of first depth portion 70 plus second depth portion 72 equals depth 64, i.e., equals $\lambda/2$.

In summary, the present invention teaches a ground-plane interface 26 between components 22 and 24 of a microwave or millimeter-wave RF assembly 20. Ground-plane interface 26 requires neither additional components nor time-consuming and/or yield-compromising production procedures. Assembly is as simple as conventional direct grounding-member contact procedures, thus is labor-conservative, does not subject components 22 and 24 to undue thermal stresses, and does not involve the use of additional devices beyond components 22 and 24 themselves. The resultant assembly 20 is easily reparable in the field in the event of a failure of component 22 and/or 23 without requiring either specialized tools or training.

Although the preferred embodiments of the invention have been illustrated and described in detail, it will be readily apparent to those skilled in the art that various modifications may be made therein without departing from the spirit of the invention or from the scope of the appended claims.

What is claimed is:

1. An RF assembly operating at a predetermined wavelength of $\lambda$ and having a ground-plane interface between a first component and a second component, said RF assembly comprising:

a bond wire coupling said first component to said second component;

a first grounding member of said first component, wherein said first grounding member establishes a first ground plane; and a second grounding member of said second component, wherein said second grounding member establishes a second ground plane, and wherein said second grounding member is coupled to said first grounding member so as to create a slot having a semi-cylindrical shape that is proximate said bond wire.

2. An RF assembly as claimed in claim 1 wherein a transverse centerline of said slot is proximate said bond wire.

3. An RF assembly as claimed in claim 2 wherein said transverse centerline is substantially parallel to a directrix of said bond wire.

4. An RF assembly as claimed in claim 3 wherein said transverse centerline and said directrix are located within a plane substantially perpendicular to one of said first and second ground planes.

5. An RF assembly as claimed in claim 1 wherein said slot has a depth substantially equal to $\lambda/2$.

6. An RF assembly as claimed in claim 5 wherein:

said first ground plane is substantially parallel to said second ground plane;

a reference ground plane substantially parallel to said first and second ground planes is between said first and second ground planes; and said depth is referenced to said reference ground plane.

7. An RF assembly as claimed in claim 6 wherein:

said first and second ground planes are substantially coplanar; and said reference ground plane is substantially coplanar with said first and second ground planes.

8. An RF assembly as claimed in claim 1 wherein:

said slot has an axis proximate and substantially parallel to a directrix of said bond wire; and said slot has a radius substantially equal to $\lambda/2$.

9. An RF assembly as claimed in claim 1 wherein:

said slot has a depth substantially equal to $\lambda/2$;

said slot progresses in a first direction for a first portion of said depth; and said slot progresses in a second direction for a second portion of said depth.

10. An RF assembly as claimed in claim 1 wherein:

said slot has a closed end so as to cause a first signal of said predetermined wavelength $\lambda$ propagating into said slot to be reflected as a second signal, and said slot has a depth such that, at an entrance to said slot, said second signal has substantially a same phase as said first signal.

11. A ground-plane interfacing method of first and second components operating at a predetermined frequency, said method comprising:

a) establishing a first ground plane with a first grounding member of said first component;

b) establishing a second ground plane with a second grounding member of said second component; c) coupling said first grounding member to said second grounding member; d) forming, as a result of said coupling activity c), a slot having a semi-cylindrical shape that is between said first and second components; and e) coupling said first component to said second component via a bond wire proximate to said slot.

12. A ground-plane interfacing method as claimed in claim 11 wherein said forming activity d) forms said slot with a depth substantially equal to $\lambda/2$.

13. A ground-plane interfacing method as claimed in claim 11 wherein:

said method additionally comprises aligning, prior to said coupling activity c), said first and second grounding members;

said coupling activity c) couples said first grounding member to said second grounding member while maintaining said aligning activity; and said forming activity d) forms said slot with a depth substantially equal to $\lambda/2$ referenced to a reference ground plane residing between said first and second ground planes.

14. A ground-plane interfacing method as claimed in claim 13 wherein said aligning activity aligns said first and second grounding members so that said first and second ground planes are substantially coplanar, and said reference ground plane is substantially coplanar with said first and second ground planes.

15. A ground-plane interfacing method as claimed in claim 11 wherein:

said coupling activity e) couples said first and second components via a bond wire having a predetermined directrix; and said forming activity d) forms said slot such that a transverse centerline of said slot is proximate and substantially parallel to said predetermined directrix.

16. A ground-plane interfacing method as claimed in claim 15 wherein said forming activity d) forms said slot so that said transverse centerline and said predetermined directrix are located within a plane substantially perpendicular to one of said first and second ground planes.

17. A ground-plane interfacing method as claimed in claim 15 wherein:

said transverse centerline being an axis of said slot having said semi-cylindrical shape; and said forming activity d) forms said slot with a radius substantially equal to $\lambda/2$.

18. A ground-plane interfacing method as claimed in claim 11 wherein:

said forming activity d) forms said slot with a depth substantially equal to $\lambda/2$;

said forming activity d) forms said slot in a first direction substantially perpendicular to one of said first and second ground planes for a first portion of said depth; and said forming activity d) forms said slot in a second direction substantially perpendicular to said first direction for a second portion of said depth.

19. An RF assembly operating at a predetermined wavelength of $\lambda$ and having a ground-plane interface between a first component and a second component, said RF assembly comprising:

a bond wire coupling said first component to said second component along a directrix of said bond wire;

a first grounding member of said first component, wherein said first grounding member establishes a first ground plane; and a second grounding member of said second component, wherein said second grounding member establishes a second ground plane substantially coplanar with said first ground plane, and wherein said second grounding member is coupled to said first grounding member so as to create a semi-cylindrical slot having an opening substantially coincident with one of said first and second ground planes, wherein said slot has an axis proximate and substantially parallel to said directrix of said bond wire, wherein said semi-cylindrical slot has a radius substantially equal to $\lambda/2$, and wherein said axis and said directrix are located within a plane substantially perpendicular to one of said first and second ground planes.

\* \* \* \* \*